United States Patent [19]

Nakajima

[11] 4,258,297
[45] Mar. 24, 1981

[54] VOLTAGE INDICATOR FOR A STROBOSCOPE

[75] Inventor: Yukio Nakajima, Hachioji, Japan

[73] Assignee: Olympus Optical Co., Ltd., Tokyo, Japan

[21] Appl. No.: 24,570

[22] Filed: Mar. 28, 1979

[30] Foreign Application Priority Data

Apr. 24, 1978 [JP] Japan ............................ 53-48503

[51] Int. Cl.³ .......................................... H05B 41/32
[52] U.S. Cl. .............................. 315/241 P; 315/136; 315/151; 354/127
[58] Field of Search ............... 315/241 P, 129, 135, 315/136, 151; 320/1; 340/660; 354/127, 145

[56] References Cited

U.S. PATENT DOCUMENTS

| 3,777,212 | 12/1973 | Mashimo | 315/241 P |
|---|---|---|---|
| 3,831,079 | 8/1974 | Iwata | 320/1 X |
| 4,068,150 | 1/1978 | Iwata et al. | 315/135 X |
| 4,163,924 | 8/1979 | Hasegawa et al. | 354/127 X |

Primary Examiner—Eugene R. LaRoche

[57] ABSTRACT

A voltage indicator for a stroboscope, having a high voltage generator (10), discharge capacitor (12), flash tube (20) and trigger circuit (22), which further comprises a light-emission diode (LED) (16) connected in series to a current path for charging the discharge capacitor (12) with electric energy; switch means (14) for selectively operating the LED (16) and a comparator (18) for selectively actuating the switch means (14). The LED (16) is not lighted when electric energy is not sufficiently stored in the discharge capacitor (12) to cause the flash tube (20) to give off flashes. When the comparator (18) detects a sufficient charge of electric energy in the discharge capacitor (12) for the light emission of the flash tube (20), then the LED (16) can be lighted.

10 Claims, 6 Drawing Figures

VOLTAGE INDICATOR FOR A STROBOSCOPE

BACKGROUND OF THE INVENTION

This invention relates to an indicator for showing the discharged voltage of a stroboscope used with a camera.

A photographic stroboscope is generally designed for the discharge of electric energy stored in a discharge capacitor through a flash tube. At the time of discharge, the flash tube sends forth a flash. The intensity of the flash varies with the static energy or voltage stored in the discharge capacitor. To ensure, therefore, a flash having a desired intensity, it is necessary to examine the voltage of the discharge capacitor. In other words, an indicator is needed which shows the voltage of the discharge capacitor.

A known indicator designed to meet this requirement is the type in which a neon discharge tube is connected to the discharge capacitor. The neon discharge tube requiring a certain discharge space is subject to limitations in being rendered compact. Accordingly, considerable difficulties are encountered in fitting a neon discharge tube type voltage indicator for stroboscope into a camera finder. In contrast, an indicator using a light-emitting diode (LED) in place of a neon discharge tube can be built in a camera finder, enabling a camera as a whole to be easily handled, because the LED can be made very compact. However, a larger amount of current is necessary for the LED to be lighted than when the neon discharge tube is lighted. Discharge current required for the neon discharge tube is about 0.01 mA. Whereas drive current of about 1 mA is required for the LED to give off a light. Therefore, direct replacement of the neon discharge tube used with the prior art indicator by a LED results in a noticeable increase in power consumption, namely, a decrease in the life of a dry cell used as a power source of a stroboscope.

SUMMARY OF THE INVENTION

It is accordingly the object of this invention to provide a voltage indicator for a stroboscope which consumes a small amount of power and is adapted to be built in a camera finder.

To attain the above-mentioned object, a voltage indicator embodying this invention comprises a high voltage generator, a discharge capacitor charged with current supplied from the high voltage generator, a flash tube impressed with voltage stored in the discharge capacitor, and a trigger circuit for triggering the flash tube, and further comprises display means connected in series to a circuit of the charge current to be lighted thereby; switch means connected to the display means to selectively provide a first condition in which the charge current is not conducted to the display means and a second condition in which the charge current is supplied to said display means; comparison means for comparing the charged voltage and a predetermined voltage, said comparison means being designed to supply a selection signal to the switch means in order to cause said switch means to selectively provide the first condition when the charged voltage falls short of the predetermined voltage and the second condition when the charged voltage has a higher level than the predetermined voltage.

With the voltage indicator of this invention arranged as described above, the idling current of the discharge capacitor is used to operate a display element, making it unnecessary to provide a separate current circuit for display purpose, and consequently saving the power consumption of a stroboscope.

DESCRIPTION OF THE PREFERRED EMBODIMENTS

There will now be described by reference to the appended drawings a voltage indicator according to the preferred embodiments of this invention. Throughout the drawings, the same or similar parts are denoted by the same or similar reference numerals to avoid duplication of description.

Figure 1:
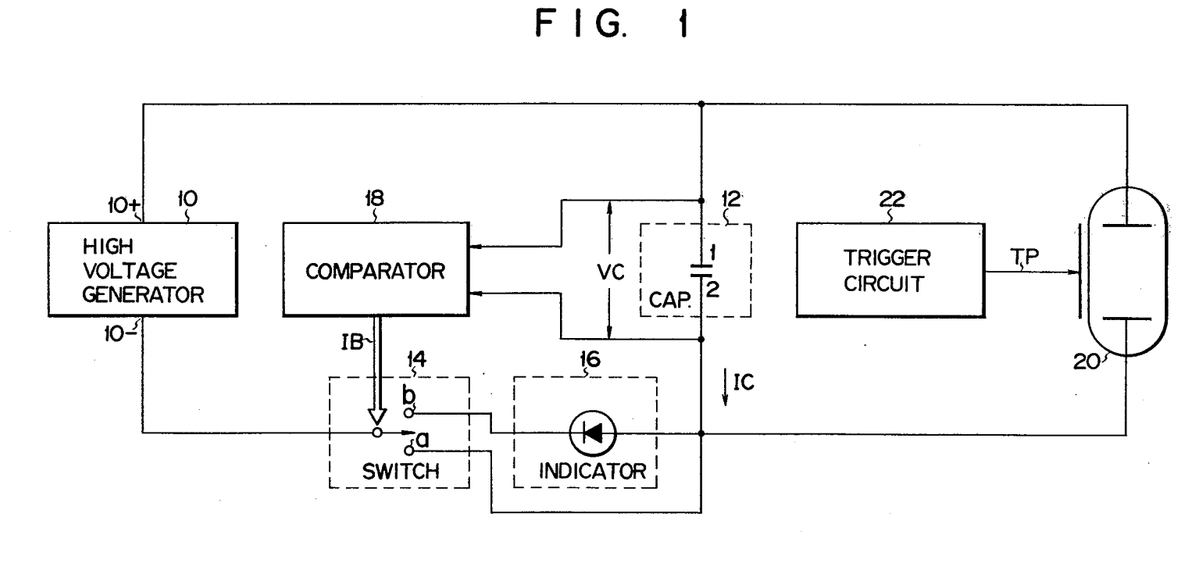
FIG. 1 is a block circuit diagram showing the fundamental arrangement of the voltage indication of this invention for a stroboscope.

FIG. 1 shows the fundamental circuit arrangement of a voltage indicator embodying this invention. The first positive output terminal 10+ of a high voltage generator 10 is connected to the first terminal of a discharge capacitor 12. The second negative output terminal 10− of the high voltage generator 10 is connected directly or indirectly to the second terminal of the discharge capacitor 12 through the switch circuit 14. Where the switch circuit 14 selects a contact a, the high voltage generator 10 is directly connected to the capacitor 12. Where the switch circuit 14 selects a contact b, the high voltage generator 10 is connected to the discharge capacitor 12 through a display element (indicator) 16.

The manner in which the operation of the switch circuit 14 is changed over is defined by the result of comparison made by a comparator 18. The comparator 18 compares a charged voltage $V_C$ or the potential difference of the first and second terminals of the discharge capacitor 12 with a predetermined voltage $V_S$. Now let it be assumed that the predetermined voltage $V_S$ is, for example, 300 volts. At this time, the comparator 18 supplies a selection signal $I_B$ to the switch circuit 14 to cause it to select the contact a, further, let it be assumed that the discharge capacitor 12 is more charged with current $I_C$ supplied from the high voltage generator 10, and that a voltage impressed across both terminals of the discharge capacitor 12 has reached a level of 300 volts. This voltage of 300 volts is detected by the comparator 18, which in turn supplies a selection signal $I_B$ to the switch circuit 14 to cause it to select the contact b. To keep a voltage impressed across both terminals of the discharge capacitor 12 at a level higher than 300 volts, it is necessary to let idling current $I_d$ run through the discharge capacitor 12. The reason for this is that since current leaks from the discharge capacitor 12 itself, the aforesaid inter-terminal voltage cannot be maintained at a level of 300 volts, unless the idling current $I_d$ is made to flow through the discharge capacitor 12.

The magnitude of the idling current $I_d$ is influenced by the capacitance of the discharge capacitor 12 and the level of voltage impressed across both terminals thereof. The idling current $I_d$ generally has a larger magnitude than 1 mA. Where the LED is used as the display element 16, this magnitude is sufficient to light said LED. Where the display capacitor 12 is charged to 300 volts, and the operation of the switch circuit 14 is changed over from the contact a to the contact b, then the display element 16 is lighted.

Both terminals of the capacitor 12 are connected to the flash electrodes of a flash tube 20. The trigger electrode of the flash tube 20 is supplied with a trigger pulse TP from a trigger circuit 22. This trigger circuit 22 is operated interlockingly with a camera shutter (not shown). Where the camera shutter is released after the display element 16 is lighted, then the flash tube 20 sends forth a flash.

The LED is most adapted to be used as the display element 16. Obviously, it is possible to substitute a small lamp or liquid crystal display device for the LED. The point is that the display element well serves the purpose if the display element requires a low voltage (lower than the order of several volts) and a small current (smaller than the order of several mA units).

Figure 2:
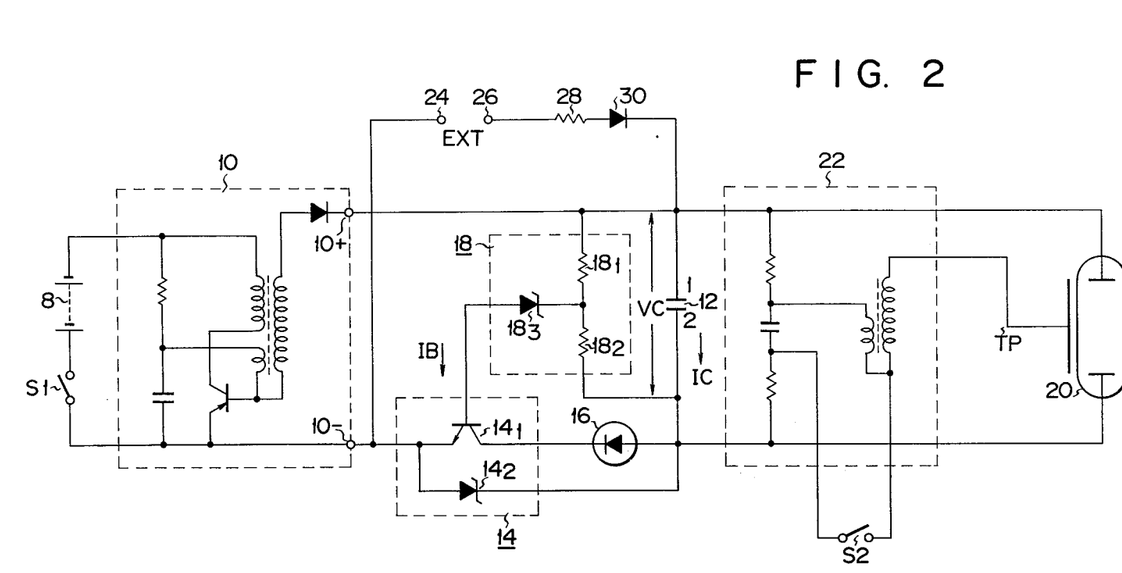
FIG. 2 is a more concrete circuit diagram of the voltage indicator than that of FIG. 1.

FIG. 2 is a more concrete circuit diagram of a voltage indicator than that of FIG. 1. The positive output terminal 10+ of the high voltage generator or DC-DC converter 10 is connected to the first terminal of the discharge capacitor 12. The second terminal of the discharge capacitor 12 is connected to the negative terminal 10− of the DC-DC converter 10 through a Zener diode $14_2$. The cathode of the Zener diode $14_2$ or the second terminal of the discharge capacitor 12 is connected to the anode of the LED 16. The cathode of the LED 16 is connected to the collector of an NPN transistor $14_1$, whose emitter is connected to the anode of the Zener diode $14_2$. The first terminal of the discharge capacitor 12 is connected to the second terminal of the discharge capacitor 12 through a series circuit consisting of resistors $18_1$ and $18_2$ to act as a voltage divider. The junction of the resistors $18_1$, $18_2$ is connected to the cathode of a Zener diode $18_3$, whose anode is connected to the base of the transistor $14_1$. The transistor $14_1$ and Zener diode $14_2$ jointly constitute the switch circuit 14. The resistors $18_1$, $18_2$ and Zener diode $18_3$ constitute the comparator 18.

Both terminals of the discharge capacitor 12 are connected to the discharge electrodes of the flash tube 20 through the trigger circuit 22. Where a contact X or switch S2 interlockingly operative with a camera shutter is closed, then the trigger circuit 22 supplies a trigger pulse TP to the trigger electrode of the flash tube 20. The DC-DC converter 10 is connected to a battery 8 through a power switch S1. The DC-DC converter 10 supplies current $I_C$ to the discharge capacitor 12 only while the power switch S1 remains closed. The negative output terminal 10− of the DC-DC converter 10 is connected to an external power supply terminal 24. An external power supply terminal 26 is connected to the positive output terminal 10+ of the DC-DC converter 10 or the first terminal of the discharge capacitor 12 through a resistor 28 and diode 30. Where the DC-DC converter 10 is not used, the contacts 24, 26 are connected to an external power source of about DC 300 V or AC 220 V.

Figure 3:
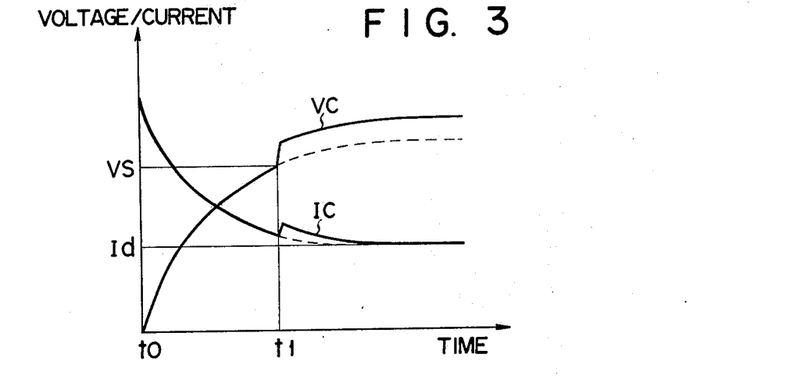
FIG. 3 graphically shows changes with time in the charged voltage $V_C$ and charged current $I_C$ of the discharge capacitor 12 of FIG. 2.

FIG. 3 indicates changes with time in the inter-terminal voltage $V_C$ and charge current $I_C$ of the discharge capacitor 12. Where the switch S1 is closed at time $t_0$, the discharge capacitor 12 begins to be charged. As time goes on, the charged voltage $V_C$ increases, and the charged current decreases. Where $V_C = V_S$ results at time $t_1$, then the Zener diode $18_3$ is rendered conducting and the transistor $14_1$ is operated. Under this condition, the Zener diode $14_2$ is short-circuited through the LED 16 and the collector-emitter path of the transistor $14_1$. Now let it be assumed that 1V represents a sum of the forward voltage drop $V_F$ of the LED 16 and the saturated voltage $V_{CE(STAT)}$ impressed across the collector and emitter of the transistor $14_1$, and the Zener voltage $V_{Z1}$ of the Zener diode $14_2$ is 5 volts. Then at time $t_1$, the inter-terminal voltage of the Zener diode $14_2$ is changed from 5 volts to 1 volt. This means that at time $t_1$, an output voltage from the DC-DC converter 10 has apparently increased by 4 volts. A slight rise in the voltage $V_C$ and current $I_C$ at time $t_1$ results from said 4-volt increase.

Before time $t_1$, the transistor $14_1$ is not operated, and the LED 16 remains extinguished. Where, after time $t_1$, the transistor $14_1$ is rendered conducting, then the LED 16 is lighted. At this time, a predetermined amount of static energy is stored in the discharged capacitor 12. After time $t_1$, the voltage $V_C$ gradually approaches the loadless output voltage of the DC-DC converter 10, and the current $I_C$ progressively approaches the idling currend $I_d$. Charges in the voltage $V_C$ or current $I_C$ at time $t_1$ (FIG. 3) do not bear an essential importance for this invention.

The prescribed voltage $V_S$ is defined as follows. Now let it be assumed that the threshold voltage $V_{BE}$ of the base-emitter path of the transistor $14_1$ is 0.5 volt; the Zener voltage $V_{Z2}$ of the Zener diode $18_3$ is 14.5 volts; and where the transistor $14_1$ is rendered conducting, the magnitude of a selection signal or base current $I_B$ is negligibly small. Further, let it be supposed that the Zener voltage $V_{Z1}$ of the Zener diode $14_2$ is 5 volts; and the resistors $18_1$, $18_2$ have resistances of 2.9 MΩ and 0.1 MΩ respectively. Where, under the above-mentioned condition, the voltage $V_C$ is 300 volts, then a voltage drop of 10 volts taken place across both terminals of the resistor $18_2$. Assuming that the emitter potential of the transistor $14_1$ is zero, a potential at the junction of the resistors $18_1$, $18_2$, or the anode potential of the Zener diode $18_3$ is 5+10=15 (volts). Since, at this time, the Zener diode $18_3$ and the base-emitter path of the transistor $14_1$ are rendered conducting, said transistor $14_1$ is operated. Under the above-mentioned conditions, the predetermined voltage $V_S$ is 300 volts.

As apparent from the foregoing description, the predetermined voltage $V_S$ varies with a sum $V_{Z2} + V_{BE}$ of the Zener voltage $V_{Z2}$ of the Zener diode $18_3$ and the threshold voltage $V_{BE}$ of the transistor $14_1$. Where, therefore, the summed voltage $V_{Z2} + V_{BE}$ varies with temperature T, then the predetermined voltage $V_S$ also changes. Neglecting, therefore, change with temperature in the resistance of the resistors $18_1$, $18_2$, change with temperature $(\partial V_S / \partial T)$ in the predetermined voltage $V_S$ may be substantially expressed by the following formula:

$$(\partial V_S/\partial T) \approx (\partial V_{Z2}/\partial T) + (\partial V_{BE}/\partial T) \qquad \ldots (1)$$

In the above formula (1), the term $(\partial V_{BE}/\partial T)$ has a negative value. Generally, with a Zener diode having a Zener voltage higher than 5 volts, the term $(\partial V_{Z2}/\partial T)$ has a positive value. Where, therefore, the Zener diode $18_3$ and transistor $14_1$ are properly combined, then the value of the term $(\partial V_S/\partial T)$ of the above equation (1) is substantially reduced to zero. Where temperature compensation is made as described above for the predetermined voltage $V_S$, then it is possible to carry out constant voltage indication, regardless of the ambient temperature of a stroboscope.

It is also possible to undertake voltage indication with the temperature coefficient of the capacitance $C_{12}$ of the capacitor 12 taken into account. Where voltage indication is made, static energy E stored in the discharge capacitor 12 is expressed as $$E = \tfrac{1}{2}C_{12}V_S^2 \qquad \ldots (2)$$

Therefore, change with temperature $(\partial E/\partial T)$ in the static energy E is expressed as $$(\partial E/\partial T) = \tfrac{1}{2}V_S^2(\partial C_{12}/\partial T) + C_{12}V_S(\partial V_S/\partial T) \qquad \ldots (3)$$

The following formula (4 is derived from the equations (1) and (3):

$$(\partial E/\partial T) = \tfrac{1}{2}V_S^2(\partial C_{12}/\partial T) + C_{12}V_S(\partial V_{Z2}/\partial T) + C_{12}V_S(\partial V_{BE}/\partial T) \qquad (4)$$

the term $(\partial V_{BE}/\partial T)$ of the above formula (4) has a negative value. However, the term $(\partial V_{Z2}/\partial T)$ of said formula (4) can be chosen to have a proper positive or negative value. It is therefore possible to substantially reduce the value of the term $(\partial E/\partial T)$ to zero by properly selecting the value of the term $(\partial V_{Z2}/\partial T)$, whether the term $(\partial C_{12}/\partial T)$ representing change with temperature in the capacitance of the capacitor 12 has a positive or negative value.

The above-mentioned temperature compensation can be effected by applying a thermistor in which either the resistor $18_1$ or the resistor $18_2$ has a negative temperature coefficient of resistance, or a posistor having a positive temperature coefficient of resistance.

Figure 4:
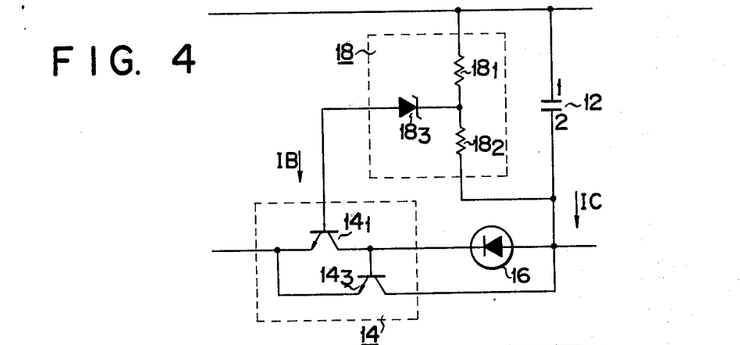
FIGS. 4 and 5 set forth modifications of the circuitly constituting the central portion of the voltage indicator of the invention shown in FIG. 2.

FIG. 4 shows the arrangement of a switch circuit modified from FIG. 2. The emitter and base of the NPN transistor $14_3$ are respectively connected to the emitter and collector of the NPN transistor $14_1$. The base of the transistor $14_3$ is connected to the second terminal of the capacitor 12 through the LED 16. The collector of the transistor $14_3$ is also connected to the second terminal of the capacitor 12. The switch circuit 14 of FIG. 4 is operated as follows. Now let it be assumed that the inter-terminal voltage $V_C$ of the capacitor 12 falls short of the predetermined voltage $V_S$. Then, the transistor $14_1$ is rendered nonconducting, causing the base of the transistor $14_3$ to be biased through the LED 16. Further, let it be supposed that the DC amplification factor $h_{FE}$ of the transistor $14_3$ is 300 and the current $I_C$ charged in the capacitor 12 varies between 100 mA and 1 mA. Then current running through the LED 16 changes between 0.3 mA and 0.003 mA. This current has a tendency to decrease in the form of an exponential function as shown in FIG. 3. Therefore, current of 0.3 mA flowing through the LED 16 immediately, after the throw-in of the power switch S1 (FIG. 2) is reduced to a level lower than 0.1 mA. Such a minute current substantially fails to light the LED 16. Though, therefore, the LED 16 is likely to be lighted momentarily right after the throw-in of the power switch S1, yet such momentary lighting of the LED 16, should it happen, will quickly cease and can be practically overlooked with respect to the proper voltage indication. While the transistor $14_1$ is rendered non-conducting, the transistor $14_3$ is put into operation. At this time, the greater part of the charged current $I_C$ is used as the collector current of the transistor $14_3$.

Now let it be assumed that the voltage $V_C$ has a level corresponding to the predetermined voltage $V_S$. In this case, the Zener diode $18_3$ of the base circuit of the transistor $14_1$ is rendered conducting. As a result, the transistor $14_1$ is put into operation, while the transistor $14_3$ becomes inoperative. At this time, all the charged current $I_C$ runs to the collector of the transistor $14_1$. Namely, where $V_C = V_S$ results, the LED 16 is properly lighted. With the embodiment of FIG. 4, changes in a voltage impressed on the emitter-collector path of the transistor $14_3$ resulting from the operation of the switch circuit 14 are as extremely small as 0.5 volt.

Figure 5:
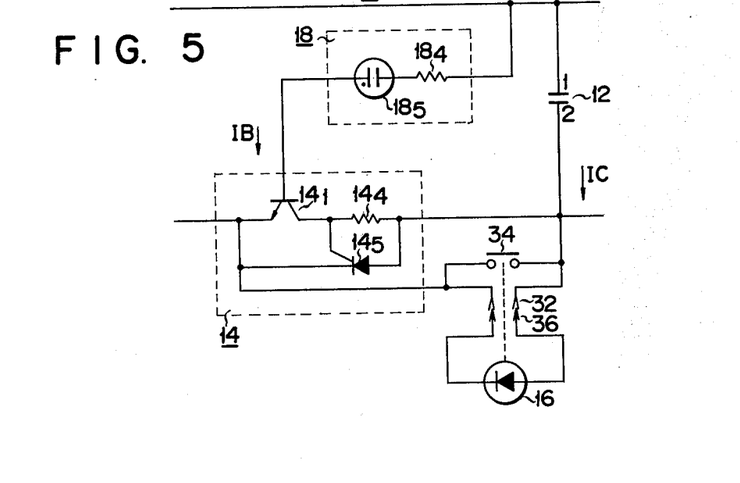

FIG. 5 indicates the arrangement of another modification of the switch circuit of FIG. 2. With this embodiments a series circuit consisting of a resistor $18_4$ and neon discharge tube $18_5$ is used as means for defining the predetermined voltage. The first terminal of the capacitor 12 is connected to the base of the NPN transistor $14_1$ through the resistor $18_4$ and neon discharge tube $18_5$. The second terminal of the capacitor 12 is connected to the collector of the transistor $14_1$ through a resistor $14_4$. The emitter and collector of the transistor $14_1$ are respectively connected to the cathode and gate of a thyristor $14_5$, whose anode is connected to the second terminal of the capacitor 12. The second terminal of the capacitor 12 is connected to the emitter of the transistor $14_1$ through a receptacle 32, to which a short-circuit switch 34 is connected in parallel. The receptacle 32 is used to receive a plug 36. When the plug 36 is inserted into the receptacle 32, the condition of the short circuit switch 34 is shifted from the short circuit mode to the nonconducting mode. LED 16 disposed within the finder of camera is connected to the plug 36.

Where a sufficient amount of current runs through the neon discharge tube $18_5$ to let it commence discharge and render the transistor $14_1$ conducting, then the inter-terminal voltage $V_C$ of the capacitor 12 corresponds to the predetermined voltage $V_S$. Immediately after the power-switch S1 (FIG. 2) is operated, the transistor $14_1$ is rendered nonconducting. As a result, the gate of the thyristor $14_5$ is quickly triggered through the resistor $14_4$. Namely, when the power switch S1 is operated, the thyristor $14_5$ is also operated immediately. At this time, the charged current $I_C$ is all conducted to the thyristor $14_5$, preventing the LED from being lighted. Where the voltage $V_C$ has a level corresponding to the predetermined voltage $V_S$, then the transistor $14_1$ is rendered conducting due to the discharge of the neon discharge tube $18_5$. At this time the gate-cathode path of the thyristor $14_5$ is short-circuited, causing the thyristor $14_5$ to be rendered nonconducting. When the thyristor $14_5$ becomes inoperative, the charged current $I_C$ is conducted to the collector of the transistor $14_1$ and the anode of the LED 16. Where, at this time, the resistor $14_4$ is chosen to have an appreciably high resistance (for example, scores of KΩ units), then almost all the current $I_C$ runs to the LED 16. In other words, where the capacitor 12 is charged up to a sufficient level of voltage to realize the discharge of the neon discharge tube $18_5$, then the LED 16 is lighted.

Figure 6:
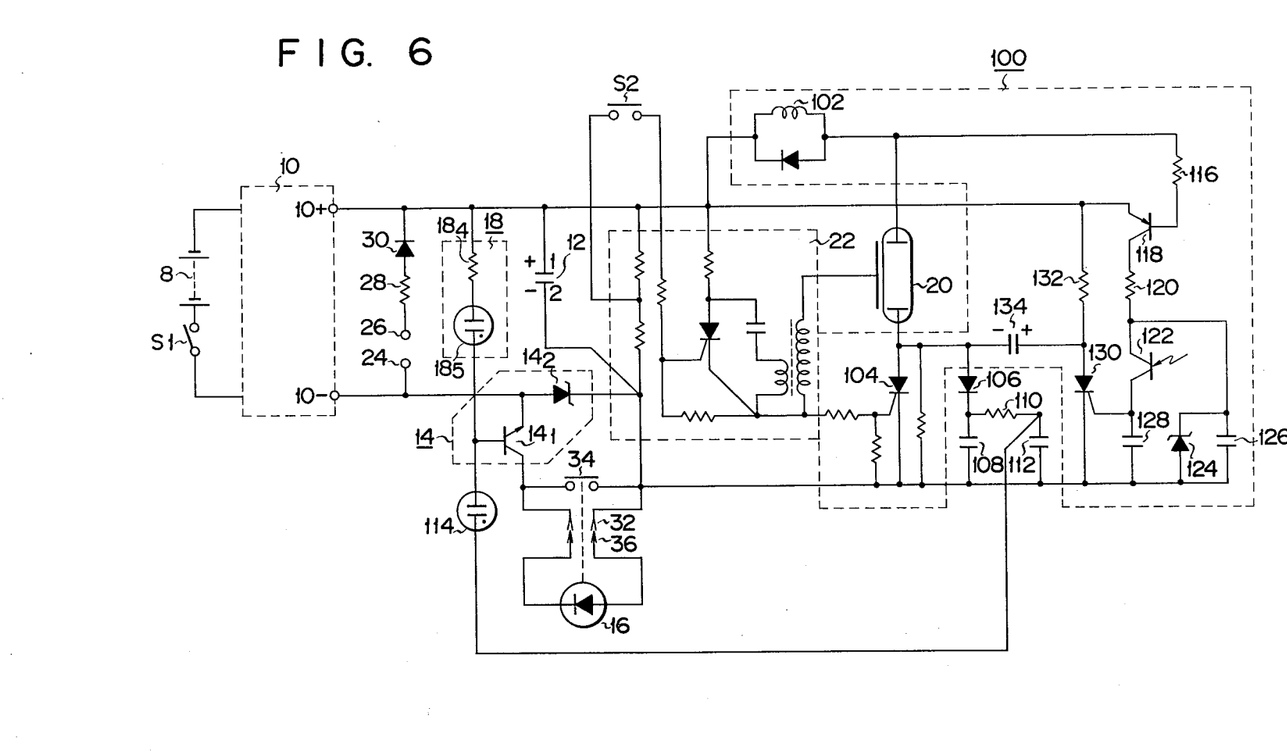
FIG. 6 is a circuit diagram of the voltage indicator of the invention applied to a stroboscope provided with an automatic light-control circuit.

FIG. 6 shows a circuit arrangement, where the voltage indicator of this invention is applied to a stroboscope having an automatic light control circuit 100.

The first electrode of the flash tube 20 is connected through a coil 102 to the first terminal or positive pole of the capacitor 12. The second electrode of the flash tube 20 is connected through a thyristor 104 to the second terminal or negative pole of the capacitor 12. The second electrode of the flash tube 20 is connected to the anode of a diode 106, whose cathode is connected to the second terminal of the capacitor 12 through a capacitor 108. The cathode of the diode 106 is connected to the second terminal of the capacitor 12 through a resistor 110 and capacitor 112. The junction of the resistor 110 and capacitor 112 is connected to the base of a NPN transistor $14_1$ through a neon discharge tube 114. The junction of the coil 102 and flash tube 20 is connected to the base of a PNP transistor 118 through a resistor 116. The emitter of the transistor 118 is connected to the first terminal or positive pole of the capacitor 12. The collector of the transistor 118 is connected through a resistor 120 to the first terminal of a phototransistor 122, which is connected to the second terminal of the capacitor 12 through the cathode-anode path of a Zener diode 124. A capacitor 126 is connected in parallel to the Zener diode 124. The second terminal of the phototransistor 122 is connected through a capacitor 128 to the second terminal of the capacitor 12, which is connected to the gate of a thyristor 130. The cathod of the thyristor 130 is connected to the second terminal of the capacitor 12. The anode of the thyristor 130 is connected to the first terminal of the capacitor 12 through a resistor 132 and also to the anode of a thyristor 104 through a commutation capacitor 134. Where the thyristor 104 is rendered nonconducting, a voltage charged in a capacitor 134 has a positive pole on the side of the thyristor 130.

Where the capacitor 12 is charged after the operation of the power switch S1 and the inter-terminal voltage $V_C$ of the capacitor 12 reaches a predetermined level, then the LED 16 is lighted. Up to this point, FIG. 6 has the same circuit constructions as FIG. 2. The lighting of the LED 16 indicates that the capacitor 12 has been fully charged. Where the switch S2 (X contact) interlockingly operative with a camera shutter is operated, then the flash tube 20 commences discharge to emit a flash. At the moment of the flash, the inter-terminal voltage of the capacitor 12 rapidly drops to stop the discharge of the neon tube $18_5$.

Where the flash tube 20 is discharged, its impedance instantly falls to about $1 \Omega$. Then a large discharge current flows from the capacitor 12 through the coil 102, flash tube 20 and thyristor 104. At the moment of said discharge, a high voltage drop is appeared across both ends of the coil 102. As a result, the base voltage of the transistor 118 falls below the first terminal voltage of the capacitor 12. Accordingly, the transistor 118 is rendered conducting, and the capacitor 126 is charged by part of a discharge current conducted from the capacitor 12. A flash sent forth from the flash tube 20 is emitted on a foreground subject (not shown). Light beams reflected from the foreground subject is received by the phototransistor 122, which in turn supplies a current corresponding to the received reflections to a capacitor 128. As a result electric energy corresponding to said received reflections is stored in said capacitor 128.

Where the capacitor 128 is progressively charged with electric energy, and the inter-terminal voltage thereof has the same level as a threshold voltage impressed on the gate-cathode path of the thyristor 130, then the thyristor 130 is rendered conducting. As a result, a capacitor 134 is connected in parallel to the anode-cathode path of the thyristor 104 through the anode-cathode path of the thyristor 130. Since the voltage charged in the capacitor 134 has such polarity as reverse-biases the anode-cathode path of the thyristor 104, this thyristor 104 is forcefully rendered nonconducting. At this time, the discharge current running through the flash tube 20 is conducted to the diode 106. In other words, the capacitor 108 is momentarily charged with discharge current occurring immediately after the turn-off the thyristor 104 or just before the extinction of the flash tube 20. As mentioned above, the capacitor 108 is charged immediately after the turn-off of the thyristor 104. Where, therefore, said charge is detected, it is possible to find the point of time at which the flash tube 20 ceases to give off flashes. When the capacitor 108 is thus charged, an amount of light emitted on a foreground subject reaches that which is defined by various associated factors of a camera, thus ensuring light control.

Electric energy stored in the capacitor 108 is progressively supplied to a capacitor 112 through the resistor 110. Where the capacitor 112 is charged with electric energy up to a prescribed level of voltage, then the neon discharge tube 114 is discharged to send forth a flash. At this time, electric energy stored in the capacitor 112 is quickly drawn off. When a voltage charged in the capacitor 112 thus falls to a level in sufficient to sustain the discharge of the neon tube 114, then the neon tube 114 is extinguished, and the capacitor 112 stops discharge. Accordingly, the capacitor 112 is again charged with electric energy stored in the capacitor 108, causing the neon discharge tube 114 to be lighted again. In other words, the neon discharge tube 114 is intermittently lighted for a prescribed length of time correspoding to an amount of electric energy stored in the capacitor 108. The intermittent issue of light beams is generally referred to as flickering. The transistor $14_1$ is intermittently operated in synchronization with said intermittent issue of light beams from the neon discharge tube 114. Accordingly, the LED 16 arranged in a canera finder is operated similarly on and off for the aforesaid prescribed period of time. The neon tube 114, resistor 110 and capacitor 112 jointly constitute a relaxation oscillation ciruclt. Even after a camera shutter is released, the LED 16 continues to be intermittently lighted. A time interval between the respective intermittent emissions of light from the LED 16, and the entire period in which the LED 16 continues the intermittent emissions of light beams can be made to vary with the capacitance of the capacitors 108, 112 and/or the resistance of the resistor 110. Where the LED 16 is made to intermittently emit light beams for some seconds after the release of a camera shutter, it is possible to prove that the automatic light control circuit 100 has been worked. In other words, the arrangement of FIG. 6 makes it possible not only to carry out voltage indication for a stroboscope, but also to make sure that the automatic light control circuit 100 has been operated.

The automatic light control circuit 100 may be formed of that which is disclosed in the Japanese patent publication Nos. 69-30905 and 75-29329. A thyristor $SCR_1$ shown in FIG. 1 appended to the former patent publication No. 69-30905 or a thyristor $SCR_{10}$ indicated in the latter patent publication No. 75-29329 correspond to the thyristor 104 of this patent application shown in FIG. 6.

Although specific circuit constructions have been illustrated and described herein, it is not intended that the invention be limited to the devices and circuits disclosed. Those skilled in the art will recognize that perticular elements or sub-circuits may be used without departing from the scope and spirit of the invention.

What is claimed is:

1. A voltage indicator for a stroboscope which comprises a high voltage generator, a discharge capacitor operatively connected to said generator so as to be adapted to be charged with a charge current supplied from the high voltage generator, a flash tube operatively connected to said capacitor so as to be adapted to be impressed with voltage stored in the discharge capacitor, and a trigger circuit for triggering the flash tube, display means connected in series with a circuit of the charge current; switch means connected to the display means to selectively provide a first condition in which the charge current is prevented from flowing into the display means and a second condition in which the charge current is supplied to said display means; comparison means for comparing the charged voltage and a predetermined voltage, said comparison means being designed to supply a selection signal to the switch means in order to cause said switch means to selectively provide the first condition when the charged voltage falls short of the predetermined voltage and the second condition where the charged voltage has a higher level than the predetermined voltage.

2. The voltage indicator according to claim 1, wherein the display means includes a light-emission diode.

3. The voltage indicator according to claim 1, wherein the switch means comprises a first transistor whose collector is connected to one of the terminals of the display means, whose emitter is connected to one of the terminals of the high voltage generator, and whose base is supplied with the selection signal for selectively providing the first condition or the second condition, and which is rendered nonconducting when the first condition is selected and is put into operation when the second condition is selected; and a first Zener diode which is connected between the other terminal of the display means and the emitter of the first transistor, and whose Zener voltage is made larger than a sum of the saturated voltage impressed on the collector-emitter path of the first transistor while remaining in the second condition and a voltage drop occurring in the display means, in order to cause said first Zener diode to be rendered conducting when the first condition is selected and is rendered nonconducting when the second condition is selected.

4. The voltage indicator according to claim 1, wherein the switch means comprises a first transistor whose collector is connected to one of the terminals of the display means, whose emitter is connected to one of the terminals of the high voltage generator, and whose base is supplied with the selection signal for sectively providing the first condition or the second condition, and which is rendered nonconducting when the first condition is selected, and is rendered conducting when the second condition is selected; and a second transistor whose collector is connected to the other terminal of the display means, whose emitter is connected to the emitter of the first transistor, and whose base is connected to the collector of said first transistor.

5. The voltage indicator according to claim 1, wherein the switch means comprises a first transistor whose collector is connected to one of the terminals of a collector resistor, whose emitter is connected to one of the terminals of the high voltage generator, and whose base is supplied with the selection signal for selectively providing the first condition or the second condition, and which is rendered nonconducting when the first condition is selected, and is rendered conducting when the second condition is selected; and a thyristor whose anode is connected to the other terminal of the collector resistor, whose cathode is connected to the emitter of the first transistor and whose gate is connected to the collector of the first transistor; and the display means is connected in parallel to the anode-cathode path of the thyristor.

6. The voltage indicator according to claim 1, wherein the comparison means comprises a voltage divider connected in parallel to the discharge capacitor; and a second Zener diode inserted into a circuit which is disposed between the voltage division output terminals of the voltage divider and the switch means to be supplied with the selection signal; and the predetermined voltage is defined by the Zener voltage of the second Zener diode and the voltage division ratio of the voltage divider.

7. The voltage indicator according to claim 1, wherein the display means is connected to a second terminal circuit of the discharge capacitor; the comparison means comprises a first discharge element connected between a first terminal circuit of the discharge capacitor and the switch means to be supplied with the selection signal; and the predetermined voltage is defined on the basis of the discharge voltage generated by the first discharge element.

8. The voltage indicator according to claim 1, which further comprises an automatic light control circuit for stopping the light emission of the flash tube in a prescribed timing to define an amount of light emitted from the flash tube; a first capacitor charged with discharge current running through the flash tube immediately before said flash tube stops light emission; a second capacitor supplied with electric energy from the first capacitor; a first resistor connected between the first capacitor and the second capacitor; and a second discharge element which is connected in parallel to the second capacitor, and has a hysteresis between the discharge-starting voltage characteristic and discharge-stopping voltage characteristic, thereby constituting a relaxation oscillation circuit together with the first resistor and second capacitor, and wherein the discharge current of the second discharge element resulting from the relaxation oscillation is supplied to the switch means together with the selection signal to indicate that the automatic light control circuit has operated.

9. The voltage indicator according to claim 3, 4 or 5, wherein the comparison means comprises a voltage divider connected in parallel to the discharge capacitor; and a second Zener diode disposed between the voltage division output terminal of the voltage divider and the base of the first transistor and connected in series to a circuit through which the selection signal runs; and a sign attached to change with temperature in the Zener voltage of the second Zener diode is chosen to be opposite to a sign attached to change with temperature in the threshold voltage of the base-emitter path of the first transistor in order to minimize change with temperature in the predetermined voltage.

10. The voltage indicator according to claim 3, 4 or 5, wherein the comparison means comprises a voltage divider connected in parallel to the discharge capacitor; the selection signal is supplied from the voltage division output terminal of the voltage divider to the base of the first transistor; and the voltage divider includes a thermistor or posistor to cause change with temperature in the base voltage of the first transistor to be offset by change with temperature in the voltage at the voltage division output terminal of the voltage divider on the basis of the emitter voltage of said first transistor in order to suppress the occurrence of change with temperature in the predetermined voltage.

* * * * *